(12) United States Patent
Higashi

(10) Patent No.: US 11,189,547 B2
(45) Date of Patent: Nov. 30, 2021

(54) SEMICONDUCTOR MODULE AND SEMICONDUCTOR MODULE MANUFACTURING METHOD

(71) Applicant: FUJI ELECTRIC CO., LTD., Kawasaki (JP)

(72) Inventor: Nobuhiro Higashi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 43 days.

(21) Appl. No.: 16/731,861

(22) Filed: Dec. 31, 2019

(65) Prior Publication Data
US 2020/0266129 A1 Aug. 20, 2020

(30) Foreign Application Priority Data
Feb. 15, 2019 (JP) .............................. JP2019-025184

(51) Int. Cl.
*H01L 23/49* (2006.01)
*H01L 23/373* (2006.01)
(Continued)

(52) U.S. Cl.
CPC .......... *H01L 23/49* (2013.01); *H01L 21/4882* (2013.01); *H01L 21/4889* (2013.01);
(Continued)

(58) Field of Classification Search
CPC ................. H01L 24/92; H01L 21/4882; H01L 2224/92247; H01L 2924/10253; H01L 2924/13055; H01L 23/3114; H01L 23/3121; H01L 23/3735; H01L 23/49551; H01L 23/49541; H01L 23/49527; H01L 2224/73265; H01L 25/50; H01L 2924/13091; H01L 21/4889; H01L 21/565
See application file for complete search history.

(56) References Cited

U.S. PATENT DOCUMENTS

| 2015/0187669 | A1 | 7/2015 | Yamada et al. |
| 2016/0211202 | A1 | 7/2016 | Yamada et al. |
| 2016/0254215 | A1* | 9/2016 | Sato .................... H01L 21/4871 257/668 |

FOREIGN PATENT DOCUMENTS

| JP | H06-291230 A | 10/1994 |
| JP | 2009-111154 A | 5/2009 |

(Continued)

*Primary Examiner* — Jasmine J Clark
(74) *Attorney, Agent, or Firm* — Rabin & Berdo, P.C.

(57) ABSTRACT

A semiconductor module includes a laminated substrate that includes a heat radiating plate, and an insulation layer having a conductive pattern thereof and being disposed on a top surface of the heat radiating plate, a semiconductor element disposed on a top surface of the conductive pattern, an integrated circuit that controls driving of the semiconductor element, a control-side lead frame having a primary surface on which the integrated circuit is disposed, and a mold resin that seals the laminated substrate, the semiconductor element, the integrated circuit, and the control-side lead frame. The control-side lead frame has a rod-shaped first pin having a first end, a first end side of the first pin extending toward the top surface of the heat radiating plate, and the heat radiating plate has at least one insertion hole into one of which the first end of the first pin is press-fitted.

13 Claims, 5 Drawing Sheets

(51) Int. Cl.
  *H01L 23/00*    (2006.01)
  *H01L 25/07*    (2006.01)
  *H01L 25/18*    (2006.01)
  *H01L 21/48*    (2006.01)
  *H01L 21/56*    (2006.01)
  *H01L 25/00*    (2006.01)
  *H01L 23/31*    (2006.01)

(52) U.S. Cl.
  CPC ........ *H01L 21/565* (2013.01); *H01L 23/3114* (2013.01); *H01L 23/3735* (2013.01); *H01L 24/73* (2013.01); *H01L 24/92* (2013.01); *H01L 25/072* (2013.01); *H01L 25/18* (2013.01); *H01L 25/50* (2013.01); *H01L 2224/73265* (2013.01); *H01L 2224/92247* (2013.01); *H01L 2924/10253* (2013.01); *H01L 2924/10272* (2013.01); *H01L 2924/1203* (2013.01); *H01L 2924/13055* (2013.01); *H01L 2924/13091* (2013.01)

(56) References Cited

FOREIGN PATENT DOCUMENTS

| | | |
|---|---|---|
| JP | 2013-102112 A | 5/2013 |
| WO | 2014/076856 A1 | 5/2014 |

* cited by examiner

SEMICONDUCTOR MODULE AND SEMICONDUCTOR MODULE MANUFACTURING METHOD

CROSS REFERENCE TO RELATED APPLICATIONS

This application is based upon and claims the benefit of priority of the prior Japanese Patent Application No. 2019-025184, filed on Feb. 15, 2019, the entire contents of which are incorporated herein by reference.

BACKGROUND OF THE INVENTION

1. Field of the Invention

The present invention relates to a semiconductor module and a semiconductor module manufacturing method.

2. Description of the Related Art

A semiconductor device includes a substrate provided with a semiconductor element such as an IGBT (Insulated Gate Bipolar Transistor), a power MOSFET (Metal Oxide Semiconductor Field Effect Transistor), and an FWD (Free Wheeling Diode), and such a semiconductor device is used in an inverter device or the like.

Inverter devices, which are widely used to drive consumer and industrial motors and the like, are configured from a semiconductor switching element (switching element) such as a MOSFET or an IGBT, and a driving integrated circuit (IC chip) that drives the semiconductor switching element. Further, as a means for reducing the device size and incorporating a protective circuit, an IPM (Intelligent Power Module) in which the switching element and the IC chip are configured into a single package is used.

A switching element such as a power chip generally emits heat, and thus such a switching element is mounted to a lead frame on an insulation substrate with high thermal conductivity. On the other hand, an IC chip is mounted to an IC chip lead frame which is different from the lead frame for a power chip. In particular, an IC chip has a low allowable junction temperature compared to a power chip, and thus in order to reduce the package size of the device, a package design which secures a temperature difference between the chips is necessary.

CITATION LIST

Patent Literature

PTL 1: JP2009-111154A
PTL 2: WO2014/076856A1

SUMMARY OF INVENTION

In PTL1, an IGBT chip is mounted to a lead frame on a heat radiating plate, but a control integrated circuit is mounted on the same lead frame as the IGBT. Therefore, the heat from the IGBT chip reaches the control integrated circuit via the lead frame, and as a result, the operation of the IPM may be limited.

In PTL2, an insulation substrate is disposed in a case to which a lead frame is integrally molded, and a semiconductor chip is mounted on the insulation substrate. The semiconductor chip and the lead frame are connected with a bonding wire, and this configuration within the case is sealed using a mold resin. In a structure which uses a mold resin to form a seal as in PTL2, it is necessary to secure a surface area for adhering the case and the insulation substrate to each other, and a side wall for sealing the mold resin is also required. Therefore, it is difficult to reduce the size of the package. Further, since an adhesive such as an insulative resin is used to adhere the case and the insulation substrate, heating is required to thermoset the adhesive and the setting time is long, and this can become a hindrance to mass production.

Considering the above, one object of the present invention is to provide a semiconductor module which can be easily produced and which can be reduced in size, as well as a method for manufacturing such a semiconductor module.

A semiconductor module according to one embodiment of the present invention is characterized by including the following: a laminated substrate that includes a heat radiating plate having a top surface and a bottom surface opposite to the top surface, and an insulation layer having a top surface, and being disposed on the top surface of the heat radiating plate, the insulation layer having a conductive pattern on the top surface thereof; a semiconductor element disposed on a top surface of the conductive pattern; an integrated circuit that controls driving of the semiconductor element; a control-side lead frame having a primary surface on which the integrated circuit is disposed; and a mold resin that seals the laminated substrate, the semiconductor element, the integrated circuit, and the control-side lead frame, wherein the control-side lead frame has a rod-shaped first pin having a first end, a first end side of the first pin extending toward the top surface of the heat radiating plate, and the heat radiating plate has at least one insertion hole, into one of which the first end of the first pin is press-fitted.

A semiconductor module manufacturing method according to one embodiment of the present invention is characterized by including the following steps: preparing a laminated substrate including a heat radiating plate and an insulation layer having a conductive pattern and being disposed on a top surface of the heat radiating plate, and a control-side lead frame having a pin to be joined to the laminated substrate; inserting and press-fitting the pin of the control-side lead frame into an insertion hole formed in the laminated substrate; mounting a semiconductor element on the laminated substrate, and mounting, on a terminal of the control-side lead frame, an integrated circuit that controls driving of the semiconductor element; and transfer molding the laminated substrate, the semiconductor element, and the integrated circuit by a mold resin.

According to the present invention, a semiconductor module can be easily produced and can be reduced in size.

DESCRIPTION OF EMBODIMENTS

Figure 1:
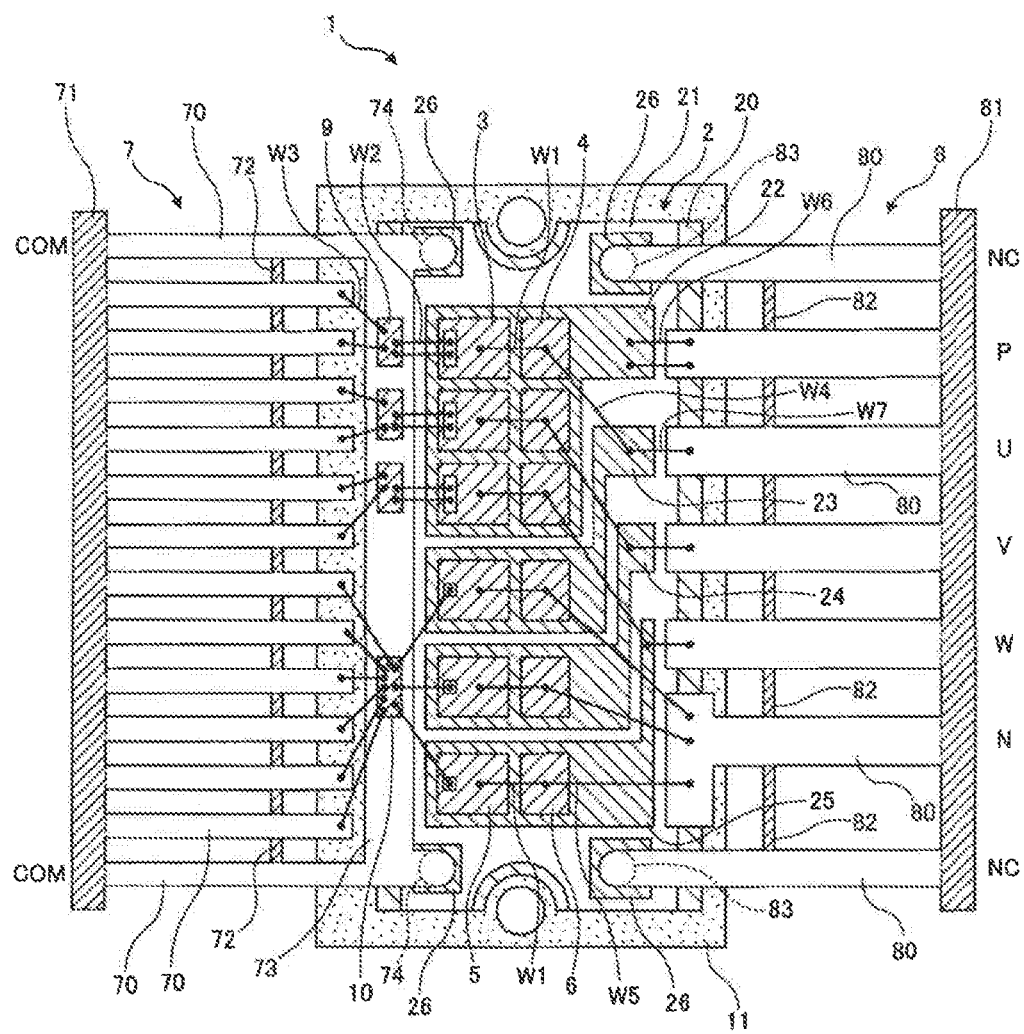
FIG. 1 is a schematic plan view of one example of a semiconductor module according to an embodiment of the present invention.
Figure 1:
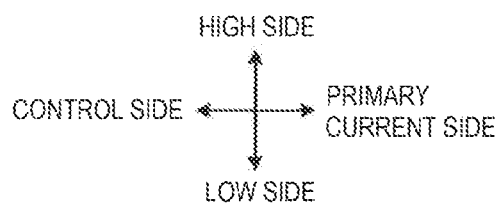
Figure 2A:
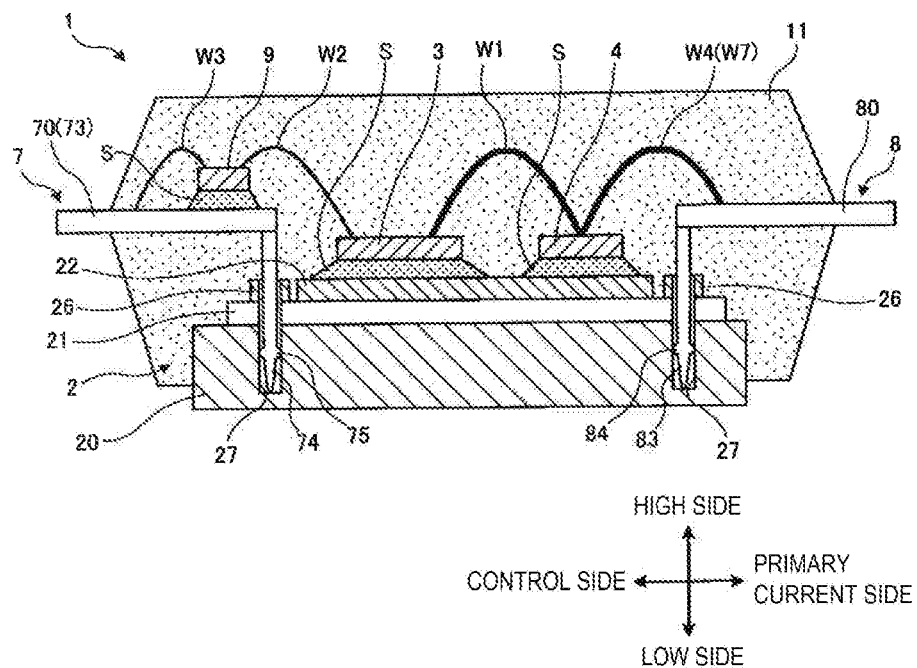
FIGS. 2A and 2B are schematic cross-section views of one example of a semiconductor module according to an embodiment of the present invention.
Figure 2B:
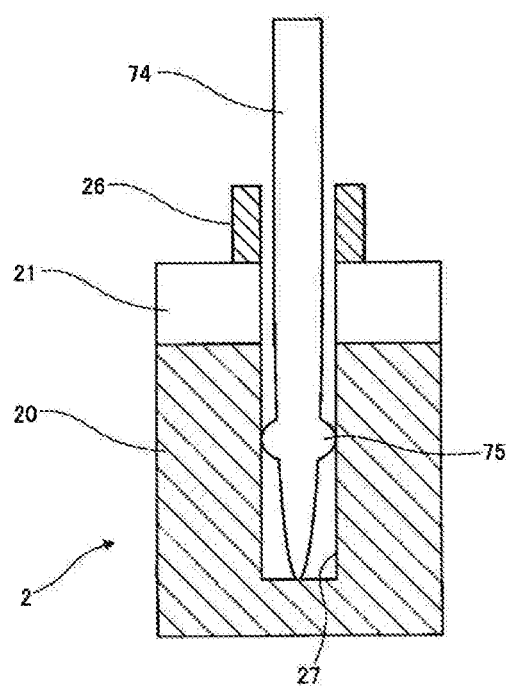

A semiconductor module to which the present invention is applicable will now be explained below. FIG. 1 is a schematic plan view of one example of a semiconductor module according to an embodiment of the present invention. FIGS. 2A and 2B are schematic cross-section views of one example of a semiconductor module according to an embodiment of the present invention. FIG. 2A is a schematic cross-section view on the high side of the semiconductor module, and FIG. 2B is a partially enlarged view of FIG. 2A. The semiconductor module explained below is merely one example, and the present invention can be appropriately modified without being limited to the semiconductor module explained below. In the present specification, a plan view indicates the case in which the semiconductor module is viewed from a direction perpendicular to a laminated substrate. Further, in the plan view of FIG. 1, the paper surface top side will be referred to as the high side, the paper surface bottom side will be referred to as the low side, the paper surface left side will be referred to as the control side, and the paper surface right side will be referred to as the primary current side.

A semiconductor module 1 is utilized in, for example, a power conversion device such as a power module. As shown in FIG. 1, the semiconductor module 1 is configured to include a laminated substrate 2, a plurality of semiconductor elements, and a plurality of integrated circuits.

As shown in FIGS. 1, 2A and 2B, the laminated substrate 2 is formed by laminating a metal layer and an insulation layer, and the laminated substrate 2 is formed in a rectangular shape in the plan view. In detail, the laminated substrate 2 is formed by disposing an insulation layer 21 on the top surface (primary surface) of a heat radiating plate 20, and disposing a plurality of conductive patterns 22 to 25 on the top surface (primary surface) of the insulation layer 21.

The heat radiating plate 20 serves as a base plate of the laminated substrate 2, and is formed in a rectangular shape in the plan view by a metal plate with good thermal conductivity such as copper or aluminum. The insulation layer 21 is formed by an insulating material such as ceramic or resin, and is formed in a rectangular shape in the plan view so as to at least partially cover the primary surface of the heat radiating plate 20. The insulation layer 21 may be formed in a rectangular shape in the plan view so as to cover the entire primary surface of the heat radiating plate 20. The insulation layer 21 is formed by, for example, a ceramic material such as alumina ($Al_2O_3$), aluminum nitride (AlN), and silicon nitride ($Si_3N_4$), a resin material such as epoxy, or an epoxy resin material in which a ceramic material is used as a filler.

The plurality of conductive patterns 22 to 25 are formed in island shapes (in a state in which the conductive patterns are electrically insulated from each other) on the primary surface of the insulation layer 21. The plurality of conductive patterns 22 to 25 are disposed such that four conductive patterns are aligned in the longer-dimension direction of the insulation layer 21, and in FIG. 1, the conductive patterns are numbered from 22 to 25 in order from the top of the paper surface. As will be explained in more detail below, high-side semiconductor elements are disposed on the conductive pattern 22 positioned on the high side, and low-side semiconductor elements are disposed on the three remaining conductive patterns 23 to 25 positioned on the low side.

A plurality of dummy patterns 26, which are formed independently from the conductive patterns 22 to 25, are formed at the four corners of the primary surface of the insulation layer 21. In this embodiment, one dummy pattern 26 is formed at each corner of the primary surface of the insulation layer 21, resulting in a total of four dummy patterns 26. The conductive patterns 22 to 25 and the dummy patterns 26 are formed by, for example, copper foil, and the conductive pattern 22 and the dummy patterns 26 may be formed with the same thickness or different thicknesses. The shape, number, and placement of the dummy patterns 26 is not limited to those described above, and modifications may be made thereto as appropriate. The same applies to the circular holes 27 and the pins to be described below.

The laminated substrate 2 configured as described above is formed by, for example, a DCB (Direct Copper Bonding) substrate or an AMB (Active Metal Brazing) substrate. As will be explained in more detail below, a circular hole 27 that penetrates through the dummy pattern 26 and the insulation layer 21 and that is formed up to a predetermined depth of the heat radiating plate 20 is provided at each of the four corners of the laminated substrate 2.

The plurality of semiconductor elements are disposed on the top surface (primary surface) of the plurality of conductive patterns 22 to 25. The semiconductor elements are formed in a rectangular shape in the plan view by, for example, a semiconductor substrate such as silicon (Si) and silicon carbide (SiC). As the semiconductor elements, a switching element such as an IGBT (Insulated Gate Bipolar Transistor) and a power MOSFET (Metal Oxide Semiconductor Field Effect Transistor), or a diode such as an FWD (Free Wheeling Diode) is used.

In the present embodiment, three power chips 3 serving as high-side IGBT elements and three power chips 4 serving as high-side FWD elements are disposed on the primary surface of the conductive pattern 22 so as to be aligned in the longer-dimension direction of the laminated substrate 2. The power chips 3 and 4 are configured as pairs, and these pairs of power chips are disposed so as to be aligned in the shorter-dimension direction of the laminated substrate 2. On the other hand, one power chip 5 serving as a low-side IGBT element and one power chip 6 serving as a low-side FWD element are disposed as a pair aligned in the shorter-dimension direction of the laminated substrate 2 on the primary surface of each of the conductive patterns 23 to 25. The IGBT elements are positioned on the control side, and the FWD elements are positioned on the primary current side. However, the present invention is not limited to this arrangement, and the IGBT elements may be positioned on the primary current side and the FWD elements may be positioned on the control side.

As the semiconductor elements, FIG. 1 illustrates a configuration in which the IGBT elements and the FWD elements are disposed and aligned in pairs. However, the present invention is not limited thereto, and an RC (Reverse Conducting)-IGBT in which an IGBT element and an FWD element are integrated, or an RB (Reverse Blocking)-IGBT which has sufficient withstand voltage relative to a reverse bias, etc. may be used. Further, the semiconductor elements are electrically connected to the conductive patterns via a bonding material such as a solder S.

The semiconductor module 1 includes a control-side lead frame 7 and a primary current-side lead frame 8 as external terminals. The control-side lead frame 7 is disposed above the control side of the laminated substrate 2, and the primary current-side lead frame 8 is disposed above the primary current side of the laminated substrate 2.

The control-side lead frame 7 is configured by aligning a plurality of plate-shaped elongated bodies, each of which has a primary surface parallel to the laminated substrate 2, in the longer-dimension direction of the laminated substrate 2, and connecting the elongated bodies to each other with another elongated body extending in the longer-dimension direction. Specifically, the control-side lead frame 7 is configured to include the following: a plurality of terminal parts 70 extending in the shorter-dimension direction of the laminated substrate 2; a tie bar 71 that connects the plurality of terminal parts 70 at one end thereof (the end on the control side); a plurality of tie bars 72 that connect adjacent terminal parts 70 at intermediate parts thereof; and an internal connection part 73 that connects, at the other end of the terminal parts 70 (the end on the primary current side), a pair (two) of the terminal parts 70 positioned at the outermost portions among the plurality of terminal parts 70.

The tie bar 71 extends in the longer-dimension direction of the laminated substrate 2 at one end side of the terminal parts 70. Each tie bar 72 extends in the longer-dimension direction of the laminated substrate 2 between terminal parts 70 which are adjacent in the longer-dimension direction. The internal connection part 73 extends in the longer-dimension direction of the laminated substrate 2 at the other end side of the terminal parts 70, and connects the two terminal parts 70 positioned at both the outside ends among the plurality of terminal parts 70 aligned in the longer-dimension direction.

These two terminal parts 70 protrude farther to the primary current side than the internal connection part 73, and the distal ends of the two terminal parts 70 are positioned on the dummy patterns 26 at the corners of the laminated substrate 2. A rod-shaped pin 74 that extends downward (toward the heat radiating plate 20) is formed on each distal end. The pins 74 will be explained below.

In the plan view shown in FIG. 1, the primary current-side lead frame 8 is disposed on the side opposite the control-side lead frame 7 with the plurality of semiconductor elements therebetween. The primary current-side lead frame 8 is configured by aligning a plurality of plate-shaped elongated bodies, each of which has a primary surface parallel to the laminated substrate 2, in the longer-dimension direction of the laminated substrate 2, and connecting the elongated bodies to each other with another elongated body extending in the longer-dimension direction. Specifically, the primary current-side lead frame 8 is configured to include the following: a plurality of terminal parts 80 extending in the shorter-dimension direction of the laminated substrate 2; a tie bar 81 that connects the plurality of terminal parts 80 at one end thereof (the end on the primary current side); and a plurality of tie bars 82 that connect adjacent terminal parts 80 at intermediate parts thereof.

The tie bar 81 extends in the longer-dimension direction of the laminated substrate 2 at one end side of the terminal parts 80. Each tie bar 82 extends in the longer-dimension direction of the laminated substrate 2 between terminal parts 80 which are adjacent in the longer-dimension direction. Among the plurality of terminal parts 80 aligned in the longer-dimension direction of the laminated substrate 2, the two terminal parts 80 positioned at both the outside ends (at the outermost portions) protrude farther to the control side than the other terminal parts 80. The distal ends of these two terminal parts 80 are positioned on the dummy patterns 26 at the corners of the laminated substrate 2. A rod-shaped pin 83 that extends downward (toward the heat radiating plate 20) is formed on each distal end. The pins 83 will be explained below.

The control-side lead frame 7 and the primary current-side lead frame 8 configured as described above are formed by a metal material such as a copper material, a copper alloy-based material, an aluminum alloy-based material, and an iron alloy-based material, and the control-side lead frame 7 and the primary current-side lead frame 8 have a prescribed electrical conductivity and a prescribed mechanical strength.

The tie bars 71, 72, 81, 82 (refer to the hatched portions in FIG. 1) are cut after being resin molded by transfer molding (to be explained below). As a result, the plurality of terminal parts 70, 80 are cut and separated (divided) as independent external terminals. In other words, the plurality of terminal parts 70, 80 are integrated by the tie bars 71, 72, 81, 82 during the course of manufacture.

In the control-side lead frame 7, among the plurality of divided terminal parts 70, the two terminal parts 70 positioned at both the outside ends are common terminals (COM terminals) and are connected to a ground potential of IC chips 9, 10. Further, in the primary current-side lead frame 8, among the plurality of divided terminal parts 80, the two terminal parts 80 positioned at both the outside ends are non-connected terminals (NC terminals) and are not electrically connected to the power chips 3 to 6 and the IC chips 9, 10. In addition, in the primary current-side lead frame 8, the plurality of divided terminal parts 80 constitute, from the paper surface top side in FIG. 1, an NC terminal, a P terminal, a U terminal, a V terminal, a W terminal, an N terminal, and an NC terminal.

In the control-side lead frame 7, a plurality of integrated circuits that control the driving of the semiconductor elements are disposed on the primary surface of the internal connection part 73 of the terminal parts 70. Specifically, on the high side, three IC chips 9 are disposed so as to be aligned in the longer-dimension direction of the internal connection part 73 as high-side high voltage integrated circuits (HVIC: High Voltage Integrated Circuit). Meanwhile, on the low side, one IC chip 10 is disposed as a low-side low voltage integrated circuit (LVIC: Low Voltage Integrated Circuit). These integrated circuits are electrically connected to the internal connection part 73 via a bonding material such as a solder S.

The IGBT elements and the FWD elements are electrically connected by wiring members W1. The IGBT elements and the integrated circuits are electrically connected by wiring members W2. The integrated circuits and the terminal parts 70 of the control-side lead frame 7 are electrically connected by wiring members W3. The power chips 4, which are the high-side FWD elements, and the low-side conductive patterns 23 to 25 are electrically connected by wiring members W4. The low-side power chips 6 and the prescribed terminal parts 80 of the primary current-side lead frame 8 are electrically connected by wiring members W5. The high-side conductive pattern 22 and the prescribed terminal part 80 of the primary current-side lead frame 8 are electrically connected by wiring members W6. The low-side conductive patterns 23 to 25 and the prescribed terminal parts 80 of the primary current-side lead frame 8 are electrically connected by wiring members W7.

Conductor wires are used for the wiring members W1 to W7 described above. As the material for such conductive wires, gold, copper, aluminum, gold alloy, copper alloy, and aluminum alloy can be used alone or in combination. Further, it is also possible to use a material other than conductive wire for the wiring members. For example, ribbon can be used as the wiring members.

The laminated substrate 2, the plurality of semiconductor elements, the plurality of integrated circuits, a portion of the control-side lead frame 7, a portion of the primary current-side lead frame 8, and the wiring members W1 to W7 described above are packaged (sealed) using a mold resin 11. As will be explained below in detail, the mold resin 11 is molded by transfer molding, and various synthetic resins can be used as the mold resin 11.

Incidentally, in a semiconductor module such as an IPM (Intelligent Power Module) in which the semiconductor elements and the IC chips are configured into a single package, the proper operation temperature range (allowable junction temperature) is different for the semiconductor elements and the integrated circuits. For example, the allowable junction temperature of the semiconductor elements is about 200° C., whereas the junction temperature of the integrated circuits is about 175° C. Therefore, a package design which takes into account the layout between the semiconductor elements and the integrated circuits is needed in order to prevent the integrated circuits from being affected by the heat of the semiconductor elements.

In a conventional semiconductor module using a case in which the external terminals are integrally molded, the semiconductor elements were disposed on the inside of the case and the integrated circuits were disposed on the external terminals on the case, and thereby a distance between the semiconductor elements and the integrated circuits was secured. However, the overall module size increased due to the case, and it was difficult to realize any reduction in the size of the overall module while also securing a distance between the semiconductor elements and the integrated circuits. Further, the curing time for the adhesive used to adhere the case also needed to be factored in, and this led to a problem in that the production efficiency was affected.

Thus, the present inventors conceived of the present invention upon placing their focus on the lead frame on which the integrated circuits are disposed and the molding method of the mold resin. Specifically, in the present embodiment, as shown in FIGS. 1 and 2A, the power chips 3 to 6 serving as the semiconductor elements are disposed on the primary surface of the conductive patterns 22 to 25 of the laminated substrate 2, and the IC chips 9, 10 serving as the integrated circuits are disposed on the primary surface of the internal connection part 73 of the control-side lead frame 7. On the distal ends of the terminal parts 70 which are continuous with the internal connection part 73, the rod-shaped pins 74 that extend substantially perpendicularly toward the laminated substrate 2 (heat radiating plate 20) are formed. Meanwhile, the circular holes 27 are formed in the laminated substrate 2 (heat radiating plate 20) as insertion holes into which the distal ends of the pins 74 are press-fitted.

According to this configuration, by press-fitting the pins 74 into the circular holes 27, the control-side lead frame 7 can be easily joined to the laminated substrate 2. Further, since the control-side lead frame 7 and the heat radiating plate 20 are joined via the pins 74 and the circular holes 27, the heat from the IC chips 9, 10 can be dissipated via the control-side lead frame 7 to the heat radiating plate 20 side. In addition, since the control-side lead frame 7 is not directly connected to the power chips 3, 4, the heat from the power chips 3, 4, is not directly transmitted to the IC chips 9, 10. Therefore, excessive heat generation by the IC chips can be prevented. Moreover, when packaging the constituent components of the semiconductor module 1 using the mold resin 11, the mold resin 11 is molded by transfer molding. Due to this configuration, a case serving as a housing is unnecessary, and thus a reduction in the size of the overall module can be realized.

As described above, the terminals on which the pins 74 are formed (the two terminal parts 70 positioned at both the outside ends among the plurality of divided terminal parts 70 in the control-side lead frame 7) are COM terminals on which the IC chips are mounted. Due to this configuration, the grounds of the IC chips 9, 10 are connected to the heat radiating plate 20 via the pins 74, and can be easily further grounded to an external ground via the heat radiating plate 20. Further, since the two terminal parts 70 on which the pins 74 are formed are positioned at the outside, i.e. both the outside ends on the high side and the low side, the terminals do not easily deviate in position when packaging with the mold resin 11. In particular, since these two terminal parts 70 are connected inside the module, it is even more difficult for the terminals to deviate in position when packaging with the mold resin 11.

In addition, on the distal ends of the terminal parts 80 of the primary current-side lead frame 8, the rod-shaped pins 83 that extend substantially perpendicularly toward the laminated substrate 2 (heat radiating plate 20) are formed. Similar to the above, the circular holes 27 are formed in the laminated substrate 2 (heat radiating plate 20) as insertion holes into which the distal ends of the pins 83 are press-fitted. According to this configuration, by press-fitting the pins 83 into the circular holes 27, the primary current-side lead frame 8 can be easily joined to the laminated substrate 2.

As described above, the terminals on which the pins 83 are formed (the two terminal parts 80 positioned at both the outside ends among the plurality of divided terminal parts 80 in the primary current-side lead frame 8) are NC terminals which are not connected to the power chips. Due to this configuration, the dummy patterns 26 on the surface (top surface) of the laminated substrate 2 are connected to the heat radiating plate 20 via the pins 83, and can be easily further grounded to an external ground via the heat radiating plate 20. Further, since the two terminal parts 80 on which the pins 83 are formed are positioned at the outside, i.e. both the outside ends on the high side and the low side, the terminals do not easily deviate in position when packaging with the mold resin 11.

Since the power chips 3 to 6 are directly joined to the laminated substrate 2 by means of the solder S, much of the heat generated by the driving of the power chips 3 to 6 can be dissipated to the outside through the heat radiating plate 20. In addition, the primary current-side lead frame 8 and the heat radiating plate 20 are joined to each other via the pins 83 and the circular holes 27. Therefore, even if some of the heat from the power chips 3 to 6 is transmitted to the primary current-side lead frame 8 through the various wiring members, this heat can be dissipated to the heat radiating plate 20 side via the pins 83 and the circular holes 27. Therefore, the heat dissipation can be further improved.

The press-fit configuration of the lead frames will now be explained in detail referring to FIGS. 2A and 2B. FIG. 2B is a partially enlarged view of the control-side lead frame, but the primary current-side lead frame has the same configuration, and thus the same operational effects as described below can also be achieved in the primary current-side lead frame.

As shown in FIGS. 2A and 2B, each circular hole 27 is formed so as to penetrate from the top surface of the laminated substrate 2 through the dummy pattern 26 and the insulation layer 21 down to a prescribed depth of the heat radiating plate 20. Therefore, the dummy pattern 26 is formed in an annular shape so as to surround the periphery of the circular hole 27.

A protruding portion 75 that protrudes radially outward is formed on each pin 74 at an intermediate position in the axial direction. The protruding portion 75 protrudes radially outward farther than the inner surface of the circular hole 27. In other words, the circular hole 27 has an inner diameter which is smaller than the outer shape of the protruding portion 75.

The distal end of the pin 74 is inserted so as to abut against the bottom surface of the circular hole 27. At this time, the protruding portion 75 is press-fitted into the circular hole 27 until the protruding portion 75 reaches the heat radiating plate 20. In this way, by press-fitting and joining the protruding portion 75, which is a portion of the pin 74, to the circular hole 27, the joining of the control-side lead frame 7 and the laminated substrate 2 is simplified.

When inserting the pins 74 into the circular holes 27, since the annular dummy patterns 26 are formed at the entrance to the circular holes 27, even if the protruding portions 75 become twisted in the insulation layer 21 during the course of being press-fitted, the formation of a burr or peeling in the insulation layer 21 can be prevented. In other words, the dummy patterns 26 function as protective members that protect the periphery of the circular holes 27 during press-fitting.

The IC chips 9, 10 are disposed at a higher position than the power chips 3 to 6. Due to this configuration, the semiconductor elements and the integrated circuits are disposed so as to be deviated from each other in the height direction, and thereby a distance between the semiconductor elements and the integrated circuits can be secured and any effects on the integrated circuits caused by heat from the semiconductor elements can be minimized. Further, since the integrated circuits can be brought closer to the semiconductor elements side in the left-right direction of the paper surface (width direction of the semiconductor module 1) in FIGS. 2A and 2B, the overall size of the semiconductor module 1 in the width direction can be reduced.

Next, a method for manufacturing the semiconductor module according to one embodiment of the present invention shall be explained referring to FIGS. 1 to 3D. FIGS. 3A to 3D are schematic views illustrating a semiconductor module manufacturing method according to an embodiment of the present invention. Specifically, FIGS. 3A to 3D illustrate states during the course of manufacturing. The semiconductor module manufacturing method explained below is merely one example, and the present invention can be appropriately modified without being limited to the semiconductor module manufacturing method explained below.

In the method for manufacturing the semiconductor module 1 according to the present embodiment, the following steps are carried out in order: a preparation step in which the laminated substrate 2, the control-side lead frame 7, and the primary current-side lead frame 8 are prepared; an insertion step in which the control-side lead frame 7 and the primary current-side lead frame 8 are inserted into the laminated substrate 2; a chip mounting step in which the power chips 3 to 6 are mounted on the laminated substrate 2, and the integrated circuits are mounted on the control-side lead frame 7; a wiring mounting step in which the wiring members W1 to W7 are mounted; and a molding step in which molding is carried out using the mold resin 11.

Figure 3A:
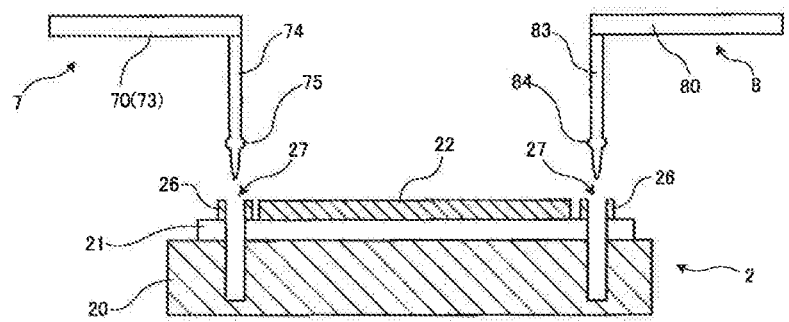
FIGS. 3A to 3D are schematic views illustrating a semiconductor module manufacturing method according to an embodiment of the present invention.

As shown in FIG. 3A, first, the laminated substrate 2, the control-side lead frame 7, and the primary current-side lead frame 8 are prepared in advance (preparation step). As described above, the circular holes 27 are formed at prescribed locations of the laminated substrate 2. Further, the control-side lead frame 7 has the pins 74 that extend vertically downward toward the laminated substrate 2, and the primary current-side lead frame 8 has the pins 83 that extend vertically downward toward the laminated substrate 2.

Figure 3B:
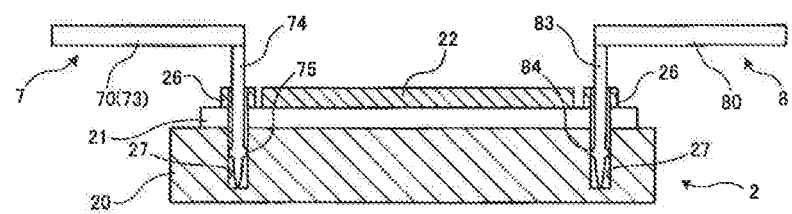

Next, the insertion step is carried out. In the insertion step, the pins 74 (pins 83) are inserted into the circular holes 27, and the protruding portions 75 (protruding portions 84) are press-fitted to the circular holes 27. As shown in FIG. 3B, the pins 74 (pins 83) are inserted until the distal ends of the pins 74 (pins 83) abut against the bottom surface of the circular holes 27, and thereby the protruding portions 75 (protruding portions 84) are press-fit. As a result, the control-side lead frame 7 (primary current-side lead frame 8) is joined to the laminated substrate 2.

The strength of the press-fitting is preferably a strength such that the pins 74 (pins 83) do not come out from the circular holes 27 during the period until the molding step (to be explained below). In more detail, the strength of the press-fitting is preferably greater than the weight of the control-side lead frame 7 (primary current-side lead frame 8) itself or greater than the weight of the laminated substrate 2 itself. In other words, the strength of the press-fitting should be ensured such that the state in which the lead frames are joined to the laminated substrate 2 at the prescribed locations can be maintained during the period until the molding step. The press-fitting is merely a temporary retention, because the lead frames and the laminated substrate 2 will be completely joined once the various constituent components of the semiconductor module 1 are packaged using the mold resin 11.

Figure 3C:
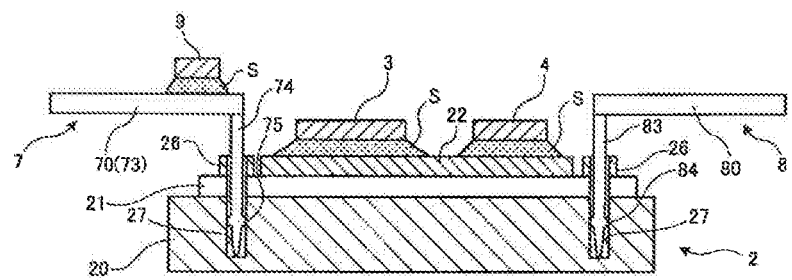

Next, the chip mounting step is carried out. As shown in FIG. 3C, in the chip mounting step, the power chips 3, 4 are mounted on the conductive pattern 22, and the power chips 5, 6 are mounted on the conductive patterns 23 to 25. Further, the IC chips 9, 10 are mounted on the primary surface of the internal connection part 73 of the control-side lead frame 7. The order in which these chips are mounted can be appropriately modified.

Figure 3D:
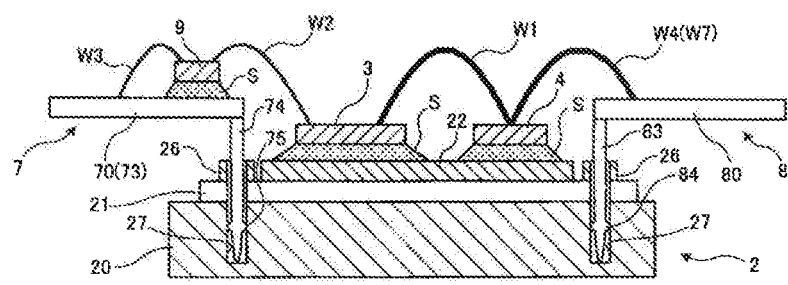

Next, the wiring member mounting step is carried out. As shown in FIG. 3D, in the wiring member mounting step, the prescribed wiring members W1 to W7 are electrically connected (by wire bonding) between the chips, between the chips and the lead frames, or between the chips and the conductive patterns. The order in which these wiring members are mounted (the wire bonding order) can be appropriately modified.

Next, the molding step is carried out. In the molding step, the constituent components of the semiconductor module 1 which were mounted during the course of manufacturing up to the wiring member mounting step are packaged by the mold resin 11. Specifically, as shown in FIG. 2A, the mold resin 11 is molded by transfer molding. By utilizing transfer molding, it is not necessary to prepare a dedicated case, and the constituent components can be sealed and integrated all at once after all the constituent components have been mounted. Therefore, the size of the semiconductor module 1 can be reduced by the amount of the case, and the course of manufacturing can be simplified because a curing time for the adhesive used to adhere the case is no longer needed. After the molding step, unnecessary portions (tie bars) of the lead frames can be cut off so as to divide the terminal parts.

Figure 4A:
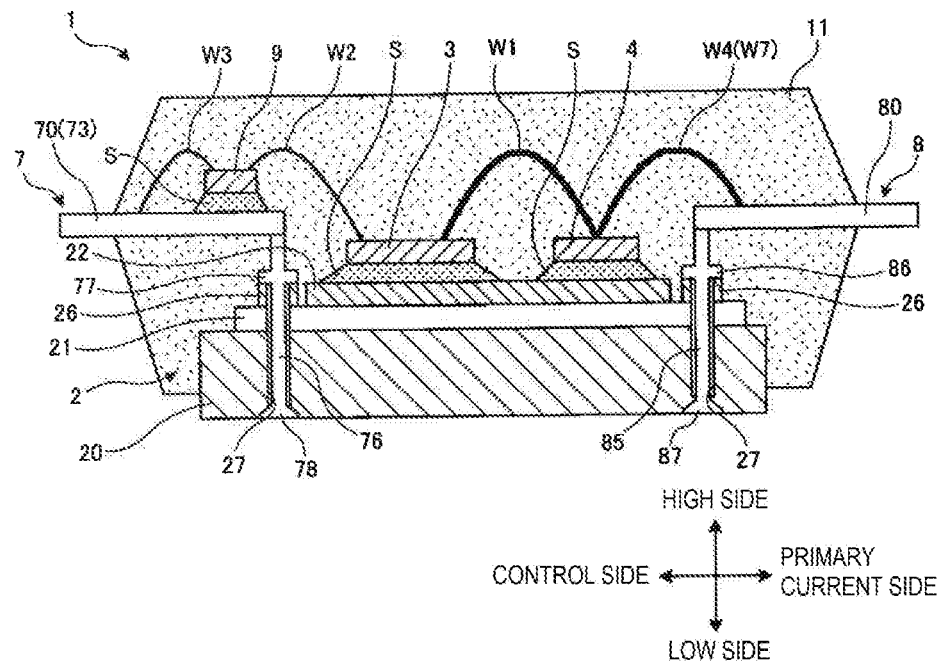
FIGS. 4A and 4B are schematic cross-section views illustrating a semiconductor module according to an alternative example.
Figure 4B:
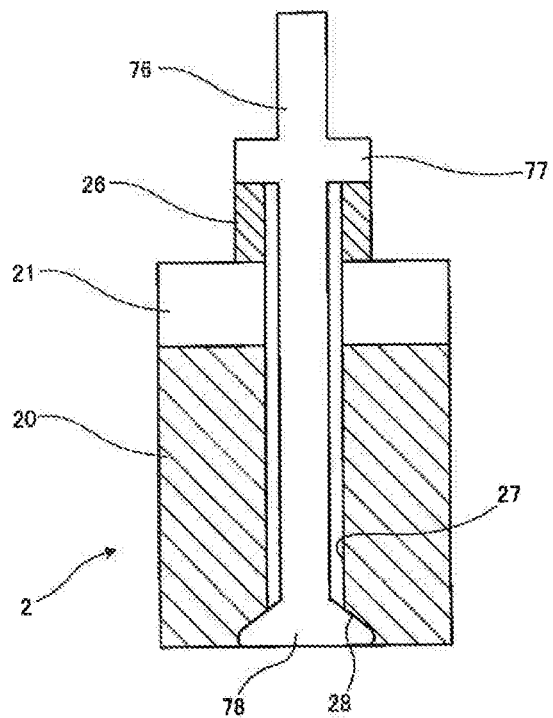

Next, referring to FIGS. 4A to 5D, a semiconductor module according to an alternative example will be explained. FIGS. 4A and 4B are schematic cross-section views illustrating the semiconductor module according to this alternative example. FIG. 4A is a schematic cross-section view on the high side of the semiconductor module, and FIG. 4B is a partially enlarged view of FIG. 4A. FIGS. 5A-5D are schematic views illustrating a method for manufacturing the semiconductor module according to the alternative example. Specifically, FIGS. 5A to 5D illustrate states during the course of manufacturing. In the alternative example explained below, only the insertion configuration of the lead frames is different from the embodiment explained above. Thus, the following explanation will focus primarily on such different portions, and configurations which have already been explained and are the same as those above will be assigned the same reference numerals and detailed explanations thereof will be appropriately omitted.

As shown in FIGS. 4A and 4B, on the distal ends of the terminal parts 70 which are continuous with the internal connection part 73 of the control-side lead frame 7, rod-shaped pins 76 that extend substantially perpendicularly toward the laminated substrate 2 (heat radiating plate 20) are formed. A protruding portion 77 that protrudes radially outward is formed on each pin 76 at an intermediate position in the axial direction.

Circular holes 27 are formed in the laminated substrate 2 (heat radiating plate 20) as insertion holes into which the distal ends of the pins 76 are inserted. Each circular hole 27 is formed so as to penetrate from the top surface of the laminated substrate 2 through the dummy pattern 26, the insulation layer 21, and the heat radiating plate 20. Therefore, the dummy pattern 26 is formed in an annular shape so as to surround the periphery of the circular hole 27. Further, a recess 28 that is recessed upwards from the bottom surface side of the heat radiating plate 20 is formed at the end on the bottom surface side of each circular hole 27.

The protruding portion 77 protrudes radially outward farther than the inner surface of the circular hole 27. In other words, the circular hole 27 has an inner diameter which is smaller than the outer shape of the protruding portion 77. The recess 28 is formed to be larger toward the radially outer side than the circular hole 27. In other words, the circular hole 27 has an inner diameter which is smaller than the inner diameter of the recess 28.

Similarly, on the distal ends of the terminal parts 80 of the primary current-side lead frame 8, rod-shaped pins 85 that extend substantially perpendicularly toward the laminated substrate 2 (heat radiating plate 20) are formed. A protruding portion 86 that protrudes radially outward is formed on each pin 85 at an intermediate position in the axial direction.

In this alternative example, the pins 76 (pins 85) are inserted until the protruding portions 77 (protruding portions 86) abut against the top surface of the dummy patterns 26. In other words, the protruding portions 77 (protruding portions 86) are positioned above the heat radiating plate 20. Further, the distal ends of the pins 76 (pins 85) that protrude from the bottom surface of the heat radiating plate 20 are caulked (swaged), and thereby caulked portions 78 (caulked portions 87) are formed on the distal ends. In this way, since the distal ends of the pins 76 (pins 85) are caulked on the bottom surface side of the heat radiating plate 20, the lead frames and the laminated substrate 2 can be easily joined to each other. In this case as well, since the protruding portions 77 (protruding portions 86) abut against the top surface of the dummy patterns 26, the formation of a burr or peeling in the insulation layer 21 can be prevented. In other words, the dummy patterns 26 function as protective members that protect the periphery of the circular holes 27.

Next, a method for manufacturing the semiconductor module according to an alternative example shall be explained. The manufacturing method of this alternative example differs from the above in that in the insertion step, a caulking step is performed in which the distal ends of the lead frames (pins) are inserted until the pins protrude from the bottom surface of the heat radiating plate 20, and then the distal ends of the protruding pins are caulked.

Figure 5A:
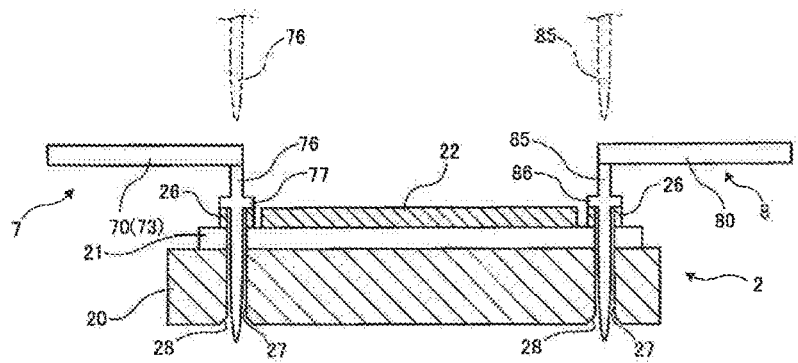
FIGS. 5A to 5D are schematic views illustrating a method for manufacturing the semiconductor module according to the alternative example.
Figure 5B:
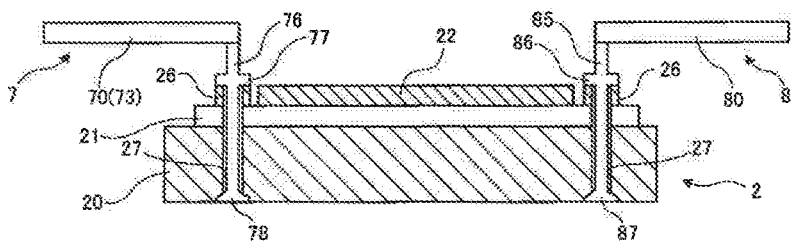

As shown in FIG. 5A, in the insertion step according to this alternative example, the pins 76 (pins 85) are inserted until the protruding portions 77 (protruding portions 86) abut against the top surface of the dummy patterns 26. As shown in FIG. 5B, the distal ends of the pins 76 (pins 85) which are protruding from the bottom surface of the heat radiating plate 20 are caulked, and thereby the caulked portions 78 (caulked portions 87) are formed on the distal ends (caulking step). As a result, the control-side lead frame 7 (primary current-side lead frame 8) is joined to the laminated substrate 2.

The strength of the caulking is preferably a strength such that the pins 76 (pins 85) do not come out from the circular holes 27 during the period until the molding step (to be explained below). In more detail, the strength of the caulking is preferably greater than the weight of the control-side lead frame 7 (primary current-side lead frame 8) itself or greater than the weight of the laminated substrate 2 itself. In other words, the strength of the caulking should be ensured such that the state in which the lead frames are joined to the laminated substrate 2 at the prescribed locations can be maintained during the period until the molding step. The caulking is merely a temporary retention, because the lead frames and the laminated substrate 2 will be completely joined once the various constituent components of the semiconductor module 1 are packaged using the mold resin 11.

Figure 5C:
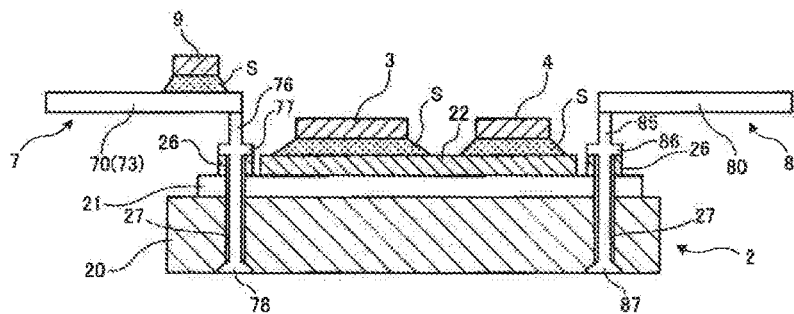
Figure 5D:
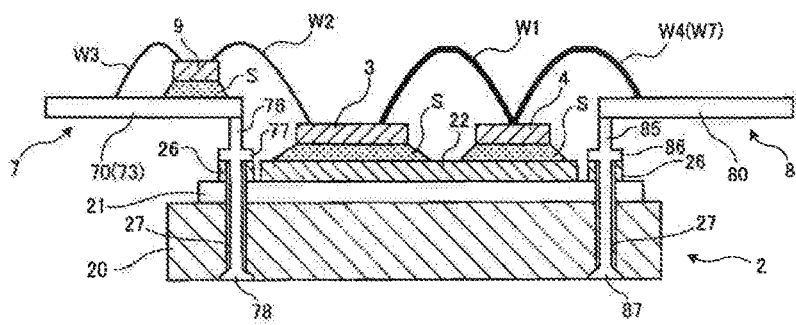

Next, the chip mounting step is carried out as shown in FIG. 5C, and then the wiring member mounting step is carried out as shown in FIG. 5D. Thereafter, the molding step is carried out as shown in FIG. 4A. These steps are the same as described above, and thus explanations thereof shall be omitted.

As described above, in the present invention, by joining a portion of the lead frames to the laminated substrate 2 by press-fitting (including caulking) and then packaging the entire semiconductor module by transfer molding, the semiconductor module 1 can be easily produced while also being reduced in size.

In the above-described embodiment, the number and location of the semiconductor elements to be disposed on the laminated substrate and the number and location of the integrated circuits to be disposed on the lead frames are not limited to those described above, and can be appropriately modified.

In the above-described embodiment, the number and layout of the conductive patterns are not limited to those described above, and can be appropriately modified.

In the above-described embodiment, the semiconductor elements and the integrated circuits were formed in a rectangular shape in the plan view, but the shape is not limited thereto. The semiconductor elements may be formed in a polygonal shape other than a rectangle.

In the above-described embodiment, a case in which the circular holes 27 are formed as insertion holes was explained, but the insertion holes are not limited to this configuration. The insertion holes are not limited to a circular shape, and can be formed in a polygonal shape. Further, the number and location of the insertion holes can also be similarly modified.

In the above-described embodiment, the pins were formed to be perpendicular to the terminal parts, but the pins are not limited to this configuration. The angle between the pins and the terminal parts can be appropriately modified. In addition, the axial direction cross-section shape of the pins is not limited to a circular shape corresponding to the insertion holes, and can be formed in a polygonal shape. Further, the number and location of the pins can also be similarly modified.

In the above-described embodiment, the protruding portions were formed at intermediate positions of the pins, and the protruding portions were press-fitted, but the protruding portions are not limited to this configuration. For example, the diameter of the entire pin can be configured to be greater than that of the insertion hole, and the entire pin can be press-fitted into the insertion hole.

In the above-described alternative example, after the pins were inserted into the insertion holes, the distal ends of the pins protruding from the bottom surface side of the heat radiating plate 20 were caulked, but the present invention is not limited to this configuration. For example, the heat radiating plate 20 can be placed on a flat-plate jig, the distal ends of the pins can be inserted until they collide with the jig, and then the insertion step and the caulking step can be carried out at once in a series of flow.

An embodiment and an alternative example were explained above, but as another embodiment, the above-described embodiment and the alternative example can be fully or partially combined.

The embodiment of the present invention is not limited to the above-described embodiment and alternative example, and can be modified, substituted, and transformed within a scope that does not deviate from the spirit of the technical idea. Further, if the technical idea can be realized in another manner by a separate technology progressed or derived from the above-described technology, the invention herein may be carried out using such a method. Therefore, the scope of the patent claim covers all embodiments which can be included within the scope of the technical idea.

The features of the above-described embodiments will now be summarized below.

The semiconductor module according to the above-described embodiments is characterized by including the following: a laminated substrate that is formed by disposing an insulation layer on the top surface of a heat radiating plate and disposing a conductive pattern on the top surface of the insulation layer; a semiconductor element that is disposed on the top surface of the conductive pattern; an integrated circuit that controls the driving of the semiconductor element; a control-side lead frame that has a primary surface on which the integrated circuit is disposed; and a mold resin that packages the laminated substrate, the semiconductor element, the integrated circuit, and the control-side lead frame, wherein the control-side lead frame has a rod-shaped pin which extends toward the heat radiating plate, and the heat radiating plate has an insertion hole into which the distal end of the pin is press-fitted.

The semiconductor module according to the above-described embodiments is characterized by further including a primary current-side lead frame disposed on the side opposite the control-side lead frame with the semiconductor element therebetween, wherein a plurality of the insertion holes are provided, and the primary current-side lead frame has a rod-shaped pin which extends toward the heat radiating plate.

The semiconductor module according to the above-described embodiments is characterized in that the pin provided to the control-side lead frame and/or the primary current-side lead frame is positioned on the outside of the laminated substrate.

The semiconductor module according to the above-described embodiments is characterized in that a terminal on which the pin is formed of the control-side lead frame is a common terminal.

The semiconductor module according to the above-described embodiments is characterized in that a terminal on which the pin is formed of the primary current-side lead frame is a non-connected terminal.

The semiconductor module according to the above-described embodiments is characterized in that the insertion hole is formed to penetrate through the insulation layer, and a dummy pattern that surrounds the periphery of the insertion hole is formed on the top surface of the insulation layer.

The semiconductor module according to the above-described embodiments is characterized in that the pin has a protruding portion that protrudes radially outward, and the insertion hole has an inner diameter which is smaller than the outer shape of the protruding portion.

The semiconductor module according to the above-described embodiments is characterized in that the insertion hole is formed up to a predetermined depth of the heat radiating plate, and the protruding portion is press-fitted until the protruding portion reaches the heat radiating plate.

The semiconductor module according to the above-described embodiments is characterized in that the insertion hole is formed to penetrate through the heat radiating plate, the protruding portion is positioned above the heat radiating plate, and the distal end of the pin is caulked on the bottom surface side of the heat radiating plate.

The semiconductor module according to the above-described embodiments is characterized in that the integrated circuit is disposed at a position higher than the semiconductor element.

The semiconductor module according to the above-described embodiments is characterized in that the mold resin is molded by transfer molding.

The method for manufacturing a semiconductor module according to the above-described embodiments is characterized by including the following steps: a preparation step in which a laminated substrate that is formed by disposing an insulation layer on the top surface of a heat radiating plate and disposing a conductive pattern on the top surface of the insulation layer, and a control-side lead frame that is to be joined to the laminated substrate are prepared; an insertion step in which a portion of the control-side lead frame is inserted and press-fitted into an insertion hole formed in the laminated substrate; a chip mounting step in which a semiconductor element is mounted on the laminated substrate, and an integrated circuit that controls the driving of the semiconductor element is mounted on the control-side lead frame; and a molding step in which the laminated substrate, the semiconductor element, and the integrated circuit are packaged by transfer molding using a mold resin.

The method for manufacturing a semiconductor module according to the above-described embodiments is characterized in that in the insertion step, a caulking step is performed in which the distal end of the control-side lead frame is inserted until the distal end protrudes from the bottom surface of the heat radiating plate, and then the protruding distal end of the control-side lead frame is caulked.

INDUSTRIAL APPLICABILITY

As explained above, the present invention has an effect in which a semiconductor module can be easily produced and can be reduced in size, and the present invention is particularly useful in a semiconductor module and a semiconductor module manufacturing method.

REFERENCE SIGNS LIST

1: semiconductor module
2: laminated substrate
3: power chip (semiconductor element)
4: power chip (semiconductor element)
5: power chip (semiconductor element)
6: power chip (semiconductor element)
7: control-side lead frame
8: primary current-side lead frame
9: IC chip (integrated circuit)
10: IC chip (integrated circuit)
11: mold resin
20: heat radiating plate
21: insulation layer
22: conductive pattern
23: conductive pattern
24: conductive pattern
25: conductive pattern
26: dummy pattern
27: circular hole (insertion hole)
28: recess
70: terminal part
71: tie bar
72: tie bar
73: internal connection part
74: pin
75: protruding portion
76: pin
77: protruding portion
78: caulked portion
80: terminal part
81: tie bar
82: tie bar
83: pin
84: protruding portion
85: pin
86: protruding portion
87: caulked portion
S: solder
W1: wiring member
W2: wiring member
W3: wiring member
W4: wiring member
W5: wiring member
W6: wiring member
W7: wiring member

What is claimed is:

1. A semiconductor module, comprising:
a laminated substrate that includes a heat radiating plate having a top surface and a bottom surface opposite to the top surface, and an insulation layer having a top surface and being disposed on the top surface of the heat radiating plate, the insulation layer having a conductive pattern on the top surface thereof;
a semiconductor element disposed on a top surface of the conductive pattern;
an integrated circuit that controls a driving of the semiconductor element;
a control-side lead frame having a primary surface on which the integrated circuit is disposed; and
a mold resin that seals the laminated substrate, the semiconductor element, the integrated circuit, and the control-side lead frame, wherein
the control-side lead frame has a rod-shaped first pin having a first end, a first end side of the first pin extending toward the top surface of the heat radiating plate, and
the heat radiating plate has at least one insertion hole, into one of which the first end of the first pin is press-fitted.

2. The semiconductor module according to claim 1, the semiconductor module having a first side and a second side opposite to the first side, the control-side lead frame being disposed at the second side, the semiconductor element being positioned between the first side and the second side, the semiconductor module further comprising:
a primary current-side lead frame disposed at the first side of the semiconductor module, wherein
the at least one insertion hole is a plurality of insertion holes, and
the primary current-side lead frame has a rod-shaped second pin having a second end, a second end side of the second pin extending toward the top surface of the heat radiating plate.

3. The semiconductor module according to claim 2, wherein the control-side lead frame has a first terminal and the primary current-side lead frame has a second terminal, the first terminal and the second terminal being positioned outside of the laminated substrate in a plan view of the semiconductor module.

4. The semiconductor module according to claim 3, wherein the first terminal of the control-side lead frame is a common terminal.

5. The semiconductor module according to claim 3, wherein the second terminal of the primary current-side lead frame is a non-connected terminal.

6. The semiconductor module according to claim 1, wherein
the at least one insertion hole reaches inside the heating plate, penetrating the insulation layer, and
the insulation layer has a dummy pattern formed on the top surface thereof, the dummy pattern surrounding a periphery of the one of the at least one insertion hole into which the first end of the first pin is press-fitted.

7. The semiconductor module according to claim 1, wherein
the first end of the first pin and the second end of the second pin each have a respective protruding portion extending radially outward therefrom, and
each of the at least one insertion hole has an inner diameter smaller than an outer diameter of the respective protruding portion.

8. The semiconductor module according to claim 7, wherein
the at least one insertion hole has a predetermined depth from the top surface of the heat radiating plate, and
each of the first pin and the second pin is press-fitted so that said each protruding portion reaches inside the heat radiating plate.

9. The semiconductor module according to claim 7, wherein the at least one insertion hole penetrates the heat radiating plate, said each protruding portion is positioned above the bottom surface of the heat radiating plate, and each of the first end of the first pin and the second end of the second pin is swaged at a bottom surface side of the heat radiating plate.

10. The semiconductor module according to claim 1, wherein the integrated circuit is disposed at a position higher with reference to the top surface of the conductive pattern than is a position of the semiconductor element.

11. The semiconductor module according to claim 1, wherein the mold resin is a transfer molded resin.

12. A method of manufacturing a semiconductor module, comprising the following steps:

preparing a laminated substrate including a heat radiating plate and an insulation layer having a conductive pattern and being disposed on a top surface of the heat radiating plate, and a control-side lead frame having a pin to be joined to the laminated substrate;

inserting and press-fitting the pin of the control-side lead frame into an insertion hole formed in the laminated substrate;

mounting a semiconductor element on the laminated substrate, and mounting, on a terminal of the control-side lead frame, an integrated circuit that controls a driving of the semiconductor element; and transfer molding the laminated substrate, the semiconductor element, and the integrated circuit by a mold resin.

13. The method of manufacturing a semiconductor module according to claim 12, wherein the inserting and press-fitting the pin includes inserting and press-fitting the pin of the control-side lead frame into the insertion hole that penetrates the heat radiation plate, until a distal end of the pin is swaged at a bottom surface of the heat radiating plate.

* * * * *